(12) United States Patent
Kim et al.

(10) Patent No.: US 11,133,055 B1
(45) Date of Patent: Sep. 28, 2021

(54) ELECTRONIC DEVICE TO PERFORM READ OPERATION AND MODE REGISTER READ OPERATION

(71) Applicant: SK hynix Inc., Icheon-si (KR)

(72) Inventors: Woongrae Kim, Icheon (KR); Seung Wook Oh, Yongin (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/009,413

(22) Filed: Sep. 1, 2020

(30) Foreign Application Priority Data

Jun. 1, 2020 (KR) .......................... 10-2020-0066110

(51) Int. Cl.
*G11C 7/22* (2006.01)
*G11C 11/4096* (2006.01)
*G11C 11/4094* (2006.01)
*G11C 11/4076* (2006.01)

(52) U.S. Cl.
CPC ...... *G11C 11/4096* (2013.01); *G11C 11/4076* (2013.01); *G11C 11/4094* (2013.01)

(58) Field of Classification Search
CPC .................................................. G11C 11/4096
USPC ....................................................... 365/194
See application file for complete search history.

(56) References Cited

U.S. PATENT DOCUMENTS

| 6,298,004 B1 * | 10/2001 | Kawasaki | ............ G11C 7/1066 365/233.12 |
| 6,711,090 B2 | 3/2004 | Fujimori | |
| 2013/0080826 A1 * | 3/2013 | Kondo | ..................... G11C 7/22 714/6.2 |
| 2020/0066325 A1 * | 2/2020 | Kang | .................. G11C 11/4087 |
| 2020/0160895 A1 * | 5/2020 | Kim | ..................... G11C 7/1066 |
| 2020/0211630 A1 * | 7/2020 | Kim | ................... G11C 11/4096 |

FOREIGN PATENT DOCUMENTS

KR             100703976 B1     4/2007

* cited by examiner

*Primary Examiner* — Min Huang
(74) *Attorney, Agent, or Firm* — William Park & Associates Ltd.

(57) ABSTRACT

An electronic device may include: a column control circuit configured to generate a column control pulse and a mode register enable signal, each with a pulse that is generated based on logic levels of a chip selection signal and a command address; and a control circuit configured to generate a read control signal to perform a read operation and a mode register read operation by delaying the column control pulse based on a logic level of the mode register enable signal and configured to generate a mode register control signal to perform the mode register read operation by delaying the column control pulse based on a logic level of the mode register enable signal.

20 Claims, 14 Drawing Sheets

ELECTRONIC DEVICE TO PERFORM READ OPERATION AND MODE REGISTER READ OPERATION

CROSS-REFERENCES TO RELATED APPLICATION

The present application claims priority to Korean application number 10-2020-0066110, filed on Jun. 1, 2020, which is incorporated by reference in its entirety.

BACKGROUND

1. Technical Field

Various embodiments generally relate to an electronic device to perform a read operation and a mode register read operation.

2. Related Art

In general, a semiconductor device with a DDR SDRAM (Double Data Rate Synchronous DRAM) performs a data read/write operation based on a command that is inputted from an external chip set. The semiconductor device needs to perform an active operation in order to perform the write operation and the read operation. The semiconductor device generates signals to perform an active operation based on a command and address inputted through a command address pin. At this time, the semiconductor device generates signals to perform a read operation and a write operation, through commands that are sequentially inputted, using a chip selection signal.

The semiconductor device includes a register that stores operation information and internal information by performing a mode register read operation. Furthermore, the semiconductor device performs the mode register read operation to output a signal that includes the operation information and internal information that are stored in the register during the mode register read operation.

SUMMARY

In an embodiment, an electronic device may include: a column control circuit configured to generate a column control pulse and a mode register enable signal, each with a pulse that is generated based on logic levels of a chip selection signal and a command address; and a control circuit configured to generate a read control signal to perform a read operation by delaying the column control pulse based on a logic level of the mode register enable signal and configured to generate a mode register read operation and a mode register control signal to perform the mode register read operation by delaying the column control pulse based on a logic level of the mode register enable signal.

In an embodiment, an electronic device may include: a control circuit configured to generate a read control signal and a mode register control signal by delaying a column control pulse based on a logic level of a mode register enable signal, configured to generate a first input control signal and a second input control signal based on the column control signal, and configured to generate a first output control signal and a second output control signal based on the mode register enable signal and the column control pulse; an operation code generation circuit configured to latch storage data, stored therein, based on the first and second input control signals and configured to output the latched storage data as an operation code based on the first and second output control signals; and an input/output circuit configured to output any one of internal data and the operation code as data based on the mode register control signal and the read control signal.

DETAILED DESCRIPTION

The term "preset" indicates that the value of a parameter is previously decided when the parameter is used in a process or algorithm. Based on an embodiment, the value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to "logic high level", a signal having a second voltage may correspond to "logic low level". Based on an embodiment, "logic high level" may be set to a voltage higher than "logic low level". Based on an embodiment, the logic levels of signals may be set to different logic levels or opposite logic levels. For example, a signal having a logic high level may be set to have a logic low level based on an embodiment, and a signal having a logic low level may be set to have a logic high level based on an embodiment.

Hereafter, exemplary embodiments will be described in more detail. The embodiments are only used to exemplify the present disclosure, and the scope of the present disclosure is not limited by the embodiments.

Various embodiments are directed to an electronic device that generates a signal to perform a read operation and a mode register read operation by delaying the signal through one delay circuit.

In accordance with the present embodiments, the electronic device can generate the signal to perform the read operation and the mode register read operation by delaying the signal through one delay circuit, thereby reducing the area.

Figure 1:
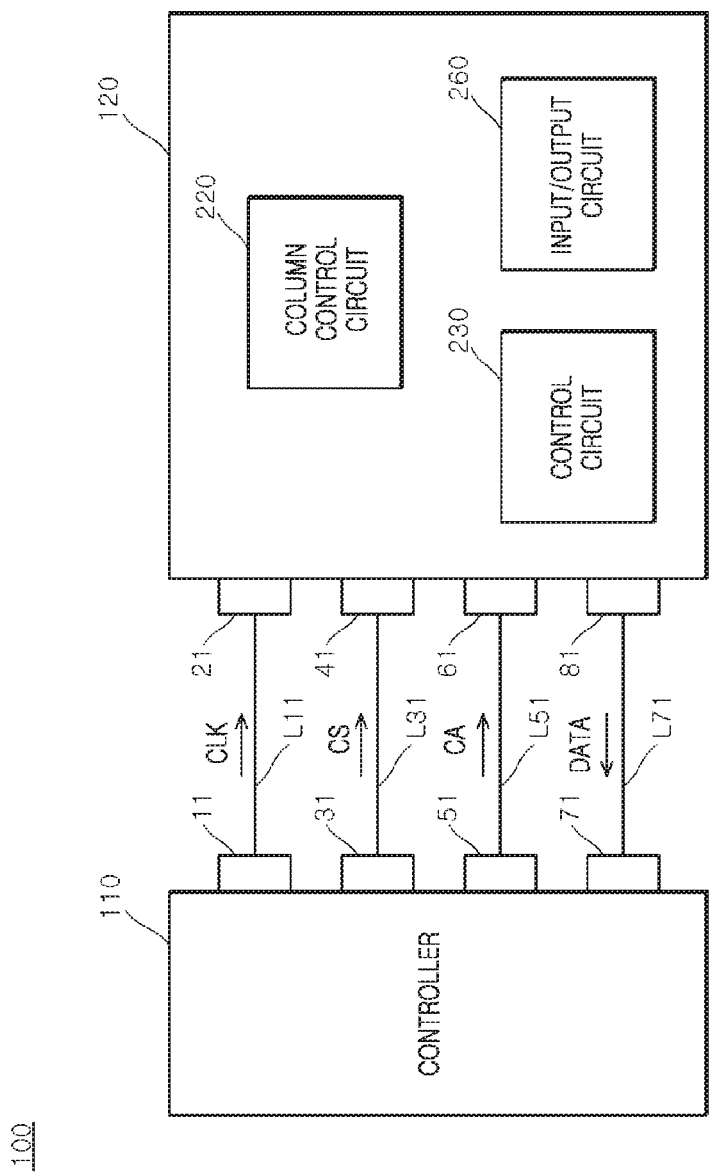
FIG. 1 is a block diagram, illustrating a configuration of an electronic device in accordance with an embodiment.

As illustrated in FIG. 1, an electronic device 100 may include a controller 110 and a semiconductor device 120. The semiconductor device 120 may include a column control circuit 220, a control circuit 230, and an input/output circuit 260.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. A first transmission line L11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 110 may transmit a clock CLK to the semiconductor device 120 through the first transmission line 11 in order to control the semiconductor device 120. The controller 110 may transmit a chip selection signal CS to the semiconductor device 120 through the second transmission line L31 in order to control the semiconductor device 120. The controller 110 may transmit a command address CA to the semiconductor device 120 through the third transmission line L51 in order to control the semiconductor device 120. The controller 110 and the semiconductor device 120 may receive data DATA through the fourth transmission line L71.

The controller 110 may output the clock CLK, the chip selection signal CS, and the command address CA to the semiconductor device 120 to perform a read operation and a mode register read operation. The controller 110 may receive the data DATA from the semiconductor device 120 during the read operation and the mode register read operation. The chip selection signal CS and the command address CA may be sequentially outputted in synchronization with odd pulses or even pulses included in the clock CLK.

The column control circuit 220 may generate a column control pulse (RD_AYP of FIG. 2) and a mode register enable signal (MRREN of FIG. 2) based on a logic level combination of the chip selection signal CS and the command address CA. The column control circuit 220 may generate the column control pulse (RD_AYP of FIG. 2) when the logic level combination of the chip selection signal CS and the command address CA is a combination to perform the read operation and the mode register read operation. The column control circuit 220 may generate the mode register enable signal (MRREN of FIG. 2) when the logic level combination of the chip selection signal CS and the command address CA is a combination to perform the mode register read operation.

Figure 2:
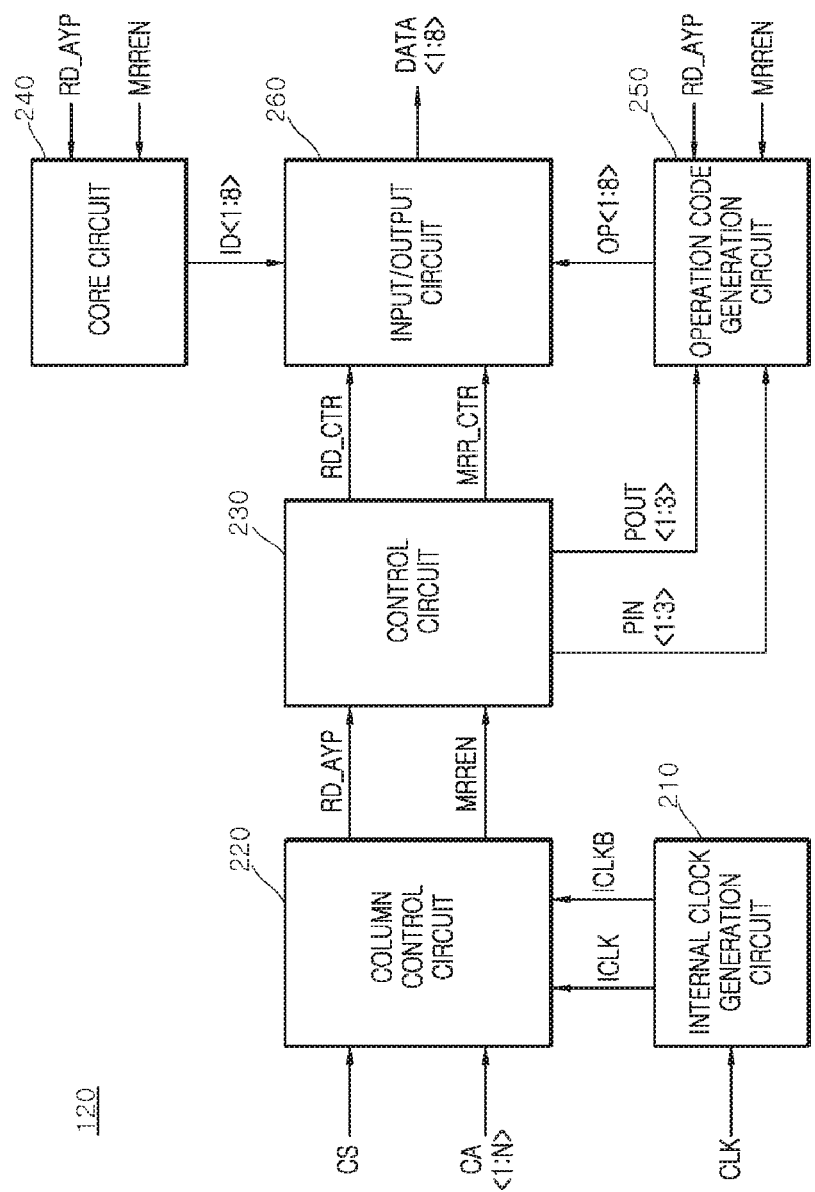
FIG. 2 is a block diagram, illustrating a configuration of a semiconductor device included in the electronic device, illustrated in FIG. 1.

The control circuit 230 may generate a read control signal (RD_CTR of FIG. 2) to perform the read operation and the mode register read operation by delaying the column control pulse (RD_AYP of FIG. 2) based on the logic level of the mode register enable signal (MRREN of FIG. 2). The control circuit 230 may generate a mode register control signal (MRR_CTR of FIG. 2) to perform the mode register read operation by delaying the column control pulse (RD_AYP of FIG. 2) based on the logic level of the mode register enable signal (MRREN of FIG. 2).

The input/output circuit 260 may output internal data (ID<1:8> of FIG. 2) as the data DATA during the read operation. The input/output circuit 260 may output an operation code (OP<1:8> of FIG. 2) as the data DATA during the more register read operation.

FIG. 2 is a block diagram, illustrating a configuration of the semiconductor device 120 in accordance with an embodiment. As illustrated in FIG. 2, the semiconductor device 120 may include an internal clock generation circuit 210, a column control circuit 220, a control circuit 230, a core circuit 240, an operation code generation circuit 250, and an input/output circuit 260.

The internal clock generation circuit 210 may receive the clock CLK and generate a first internal clock ICLK and a second internal clock ICLKB. The internal clock generation circuit 210 may generate the first internal clock ICLK and the second internal clock ICLKB by controlling the phase of the clock CLK. The internal clock generation circuit 210 may generate the first internal clock ICLK and the second internal clock ICLKB by dividing the frequency of the clock CLK. The internal clock generation circuit 210 may generate the first internal clock ICLK and the second internal clock ICLKB, which have a frequency that corresponds to ½ of the frequency of the clock CLK. The clock CLK may be set to a signal that periodically toggles to control the operation of the electronic device 100. The operation of the internal clock generation circuit 210 to generate the first internal clock ICLK and the second internal clock ICLKB by dividing the frequency of the clock CLK will be described in detail with reference to FIG. 3, which will be described below.

The column control circuit 220 may generate the column control pulse RD_AYP and the mode register enable signal MRREN based on a logic level combination of the chip selection signal CS and the command address CA<1:N> in synchronization with the first internal clock ICLK and the second internal clock ICLKB. The column control circuit 220 may generate the column control pulse RD_AYP with a pulse that is generated when the logic level combination of the chip selection signal CS and the command address CA<1:N> is a combination to perform the read operation in synchronization with the first internal clock ICLK and the second internal clock ICLKB. The column control circuit 220 may generate the column control pulse RD_AYP with a pulse that is generated when the logic level combination of the chip selection signal CS and the command address CA<1:N> is a combination to perform the mode register read operation in synchronization with the first internal clock ICLK and the second internal clock ICLKB. The column control circuit 220 may generate the mode register enable signal MRREN that is enabled when the logic level combination of the chip selection signal CS and the command address CA<1:N> is a combination to perform the mode register read operation in synchronization with the first internal clock ICLK and the second internal clock ICLKB. The pulse included in the column control pulse RD_AYP may be set to a logic high-level pulse. The logic level at that the mode register enable signal MRREN is enabled may be set to a logic high level.

The control circuit 230 may generate the read control signal RD_CTR to perform the read operation and the mode register read operation by delaying the column control pulse RD_AYP based on the logic level of the mode register enable signal MRREN. The control circuit 230 may generate a mode register control signal MRR_CTR to perform the mode register read operation by delaying the column control pulse RD_AYP based on the logic level of the mode register enable signal MRREN. The control circuit 230 may generate first to third input control signals PIN<1:3>, which are sequentially enabled, based on the column control pulse RD_AYP. The control circuit 230 may generate first to third output control signals POUT<1:3>, which are sequentially enabled, based on the mode register enable signal MRREN and the column control pulse RD_AYP.

The core circuit 240 may output internal data ID<1:8>, stored therein, during the read operation based on the column control pulse RD_AYP and the mode register enable signal MRREN. The core circuit 240 may output the internal data ID<1:8>, stored therein, when the column control pulse RD_AYP is inputted and the mode register enable signal MRREN is disabled.

The operation code generation circuit 250 may latch storage data (SE<1:8> of FIG. 8), stored therein, based on the first to third input control signals PIN<1:3>, during the mode register read operation based on the column control pulse RD_AYP and the mode register enable signal MRREN. The operation code generation circuit 250 may output the storage data (SE<1:8> of FIG. 8), stored therein, as the operation code OP<1:8> based on the first to third output control signals POUT<1:3>, during the mode register read operation based on the column control pulse RD_AYP and the mode register enable signal MRREN.

The input/output circuit 260 may output the internal data ID<1:8> as data DATA<1:8> based on the read control signal RD_CTR and the mode register control signal MRR_CTR during the read operation. The input/output circuit 260 may output the operation code OP<1:8> as the data DATA<1:8> based on the read control signal RD_CTR and the mode register control signal MRR_CTR during the mode register read operation.

Figure 3:
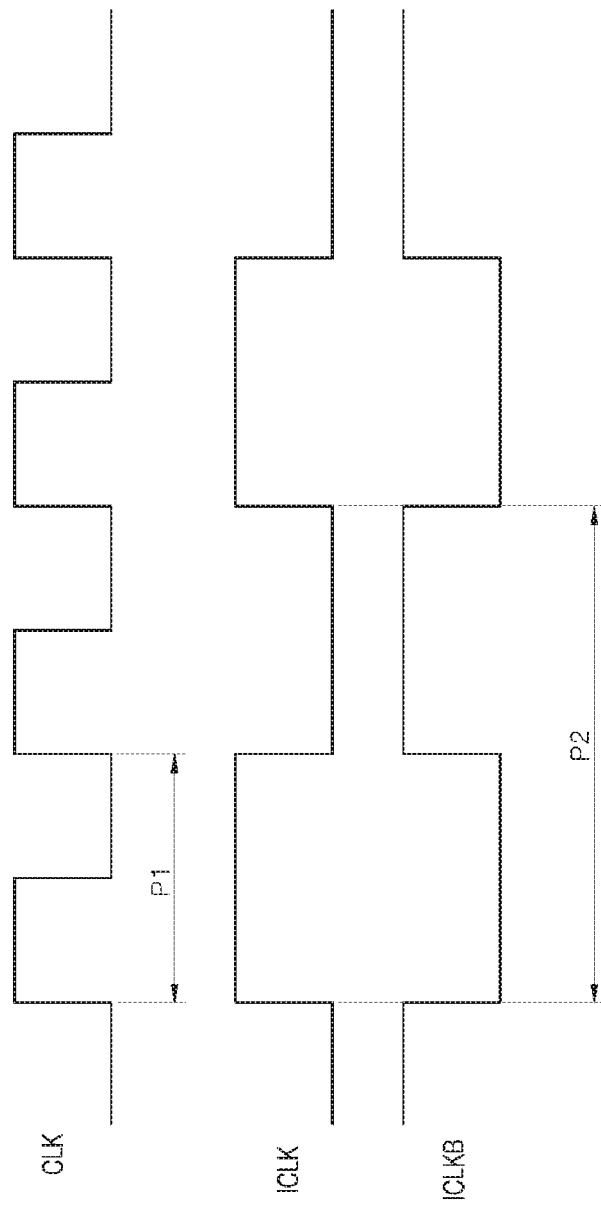
FIG. 3 is a diagram for describing an operation of an internal clock generation circuit that is included in the semiconductor device as illustrated in FIG. 2.

Referring to FIG. 3, the operation of the internal clock generation circuit 210 will be described as follows.

The internal clock generation circuit 210 may generate the first internal clock ICLK and the second internal clock ICLKB by dividing the frequency of the clock CLK. One period P2 of each of the first and second internal clocks ICLK and ICLKB may be set to a period that is twice longer than one period P1 of the clock CLK. The frequency of each of the first and second internal clocks ICLK and ICLKB may be set to ½ of the frequency of the clock CLK. The first and second internal clocks ICLK and ICLKB may toggle in synchronization with rising edges of the clock CLK. The first and second internal clocks ICLK and ICLKB may be exactly out of phase from each other.

Figure 4:
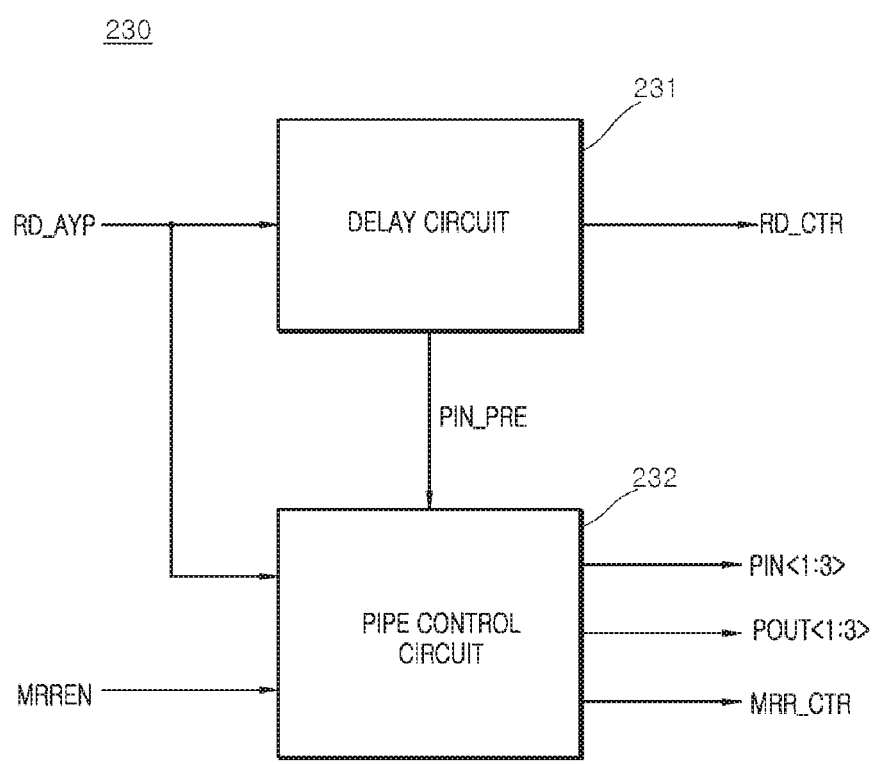
FIG. 4 is a block diagram, illustrating a configuration of a control circuit that is included in the semiconductor device as illustrated in FIG. 2.

Referring to FIG. 4, the control circuit 230 may include a delay circuit 231 and a pipe control circuit 232.

The delay circuit 231 may generate a pre-input control signal PIN_PRE and the read control signal RD_CTR, with pulses, which are sequentially generated, by delaying the column control pulse RD_AYP.

The delay circuit 231 may generate the pre-input control signal PIN_PRE by delaying the column control pulse RD_AYP. The delay circuit 231 may generate the read control signal RD_CTR by delaying the pre-input control signal PIN_PRE. The delay amount of the delay circuit 231 may be set to the same delay amount as the time required for the core circuit 240 to output the internal data ID<1:8>. The delay amount of the delay circuit 231 may be set to the same delay amount as the time required for the operation code generation circuit 250 to output the operation code OP<1:8>.

The pipe control circuit 232 may generate the first to third input control signals PIN<1:3>, which are sequentially enabled, during the mode register read operation. The pipe control circuit 232 may generate the first to third input control signals PIN<1:3>, which are sequentially enabled, based on the column control pulse RD_AYP. The pipe control circuit 232 may generate the mode register control signal MRR_CTR from the mode register enable signal MRREN based on the first to third input control signals PIN<1:3>. The pipe control circuit 232 may latch the mode register enable signal MRREN based on the first to third input control signals PIN<1:3>. The pipe control circuit 232 may generate the mode register control signal MRR_CTR from the latched mode register enable signal MRREN. The pipe control circuit 232 may generate the first to third output control signals POUT<1:3>, which are sequentially enabled, during the mode register read operation. The pipe control circuit 232 may generate the first to third output control signals POUT<1:3>, which are sequentially enabled, from the mode register control signal MRR_CTR and the pre-input control signal PIN_PRE.

Figure 5:
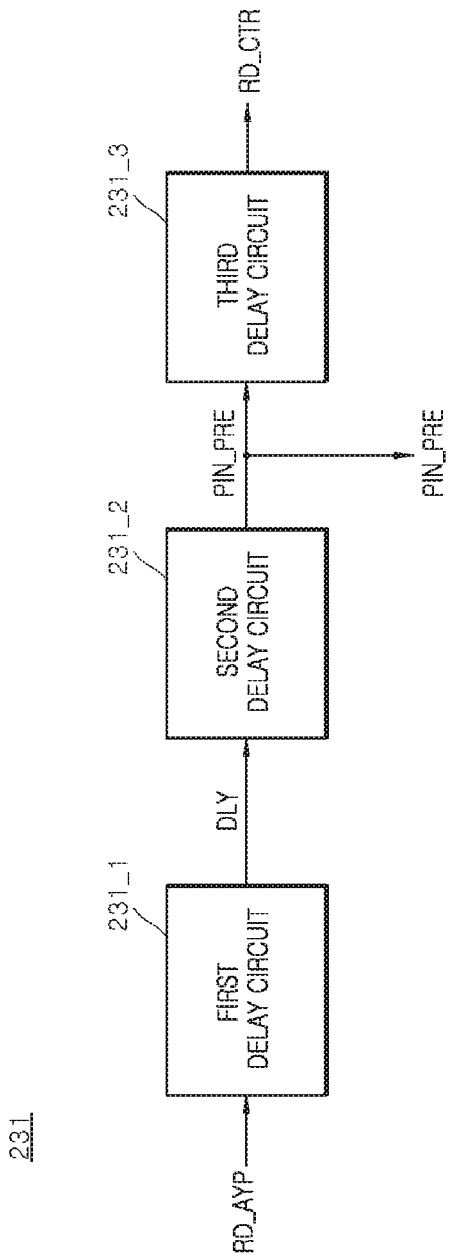
FIG. 5 is a block diagram, illustrating a configuration of a delay circuit that is included in the control circuit as illustrated in FIG. 4.

Referring to FIG. 5, the delay circuit 231 may include a first delay circuit 231_1, a second delay circuit 231_2 and a third delay circuit 231_3.

The first delay circuit 231_1 may generate a delay signal DLY by delaying the column control pulse RD_AYP.

The second delay circuit 231_2 may generate the pre-input control signal PIN_PRE by delaying the delay signal DLY.

The third delay circuit 231_3 may generate the read control signal RD_CTR by delaying the pre-input control signal PIN_PRE.

The first to third delay circuits 231_1 to 231_3 may be set to have the same delay amount. The sum of the delay amounts of the first to third delay circuits 231_1 to 231_3 may be set to the same delay amount as the time required for the core circuit 240 to output the internal data ID<1:8>. The sum of the delay amounts of the first to third delay circuits 231_1 to 231_3 may be set to the same delay amount as the time required for the operation code generation circuit 250 to output the operation code OP<1:8>.

Figure 6:
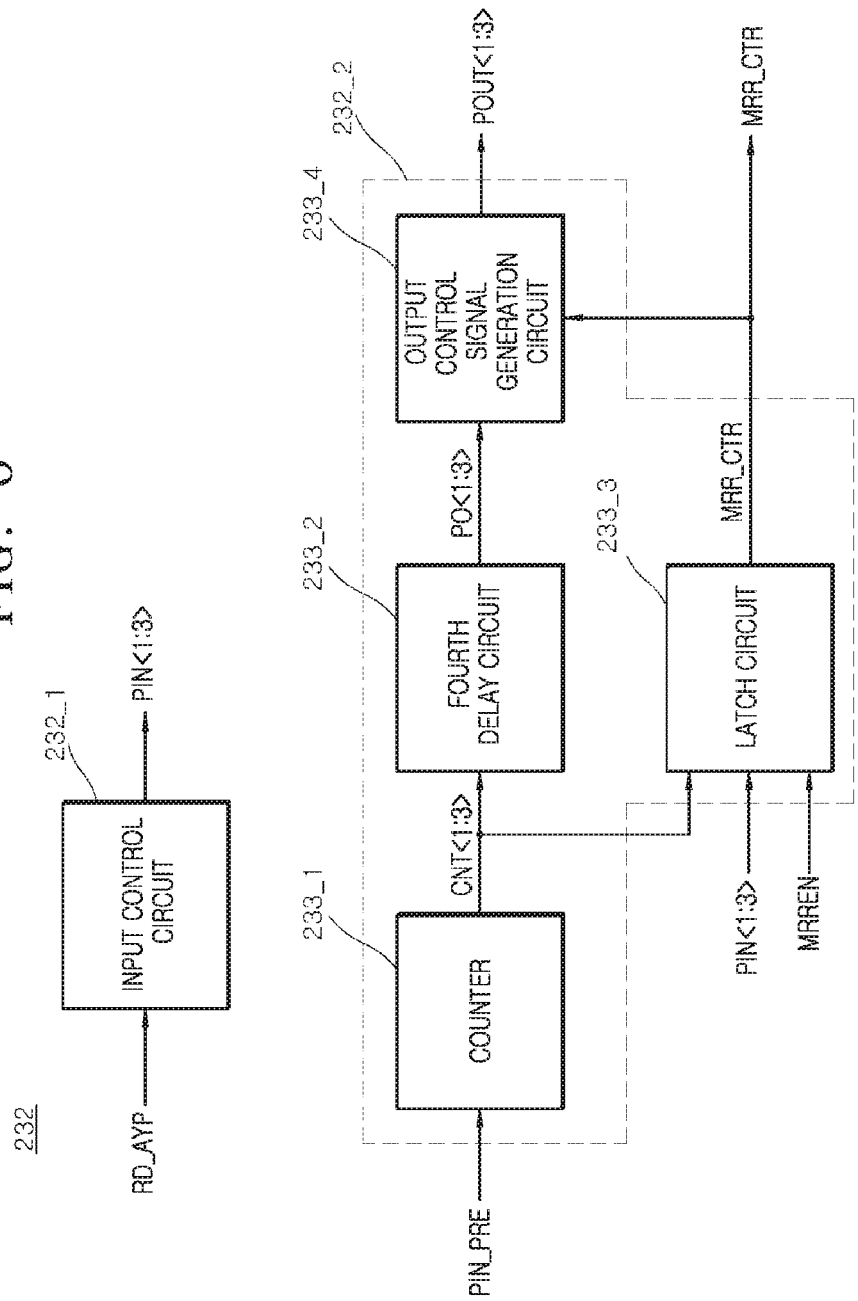
FIG. 6 is a block diagram, illustrating a configuration of a pipe control circuit that is included in the control circuit, illustrated in FIG. 4.

Referring to FIG. 6, the pipe control circuit 232 may include an input control circuit 232_1 and an output control circuit 232_2. The output control circuit 232_2 may include a counter 233_1, a fourth delay circuit 233_2, a latch circuit 233_3 and an output control signal generation circuit 233_4.

The input control circuit 232_1 may generate the first to third input control signals PIN<1:3>, which are sequentially counted, based on pulses of the column control pulse RD_AYP. The input control circuit 232_1 may generate the first to third input control signals PIN<1:3>, which are sequentially counted, when the pulses of the column control pulse RD_AYP are inputted at a logic high level. For example, the input control circuit 232_1 may enable the first input control signal PIN<1> when the pulse of the column control pulse RD_AYP is inputted once. The input control circuit 232_1 may be implemented to enable the first input control signal PIN<1> when the pulse of the column control pulse RD_AYP is inputted after the third input control signal PIN<3> is enabled.

The counter 233_1 may generate first to third counting signals CNT<1:3>, which are sequentially counted, based on pulses of the pre-input control signal PIN_PRE.

The counter 233_1 may generate the first to third counting signals CNT<1:3>, which are sequentially counted, when the pulses of the pre-input control signal PIN_PRE are inputted at a logic high level. For example, the counter 233_1 may enable the first counting signal CNT<1> when the pulse of the pre-input control signal PIN_PRE is inputted once. The counter 233_1 may be implemented to enable the first counting signal CNT<1> when the pulse of the pre-input control signal PIN_PRE is inputted after the third counting signal CNT<3> is enabled.

The fourth delay circuit 233_2 may generate first to third pre-output control signals PO<1:3> by delaying the first to third counting signals CNT<1:3>. Based on an embodiment, the delay amount of the fourth delay circuit 233_2 may be set to various values.

The latch circuit 233_3 may latch the mode register enable signal MRREN based on pulses of the first to third input control signals PIN<1:3>. The latch circuit 233_3 may latch the mode register enable signal MRREN when the pulse of any one of the first to third input control signals PIN<1:3> is inputted. The latch circuit 233_3 may generate the more register control signal MRR_CTR from the latched mode register enable signal MRREN based on the pulses of the first to third counting signals CNT<1:3>. The latch circuit 233_3 may output the latched mode register enable signal MRREN as the mode register control signal MRR_CTR, when the pulse of any one of the first to third counting signals CNT<1:3> is inputted.

The output control signal generation circuit 233_4 may generate the first to third output control signals POUT<1:3> from the first to third pre-output control signals PO<1:3> during a period in which the mode register control signal MRR_CTR is enabled. The output control signal generation circuit 233_4 may output the first to third pre-output control signals PO<1:3> as the first to third output control signals POUT<1:3> during a period in which the mode register control signal MRR_CTR is enabled to a logic high level. The output control signal generation circuit 233_4 may block the generation of the first to third output control signals POUT<1:3> during a period in which the mode register control signal MRR_CTR is disabled.

The output control circuit 232_2 may generate the mode register control signal MRR_CTR by latching the mode register enable signal MRREN based on the first to third input control signals PIN<1:3>. The output control circuit 232_2 may generate the first to third output control signals POUT<1:3> from the pre-input control signal PIN_PRE based on the logic level of the mode register control signal MRR_CTR.

Figure 7:
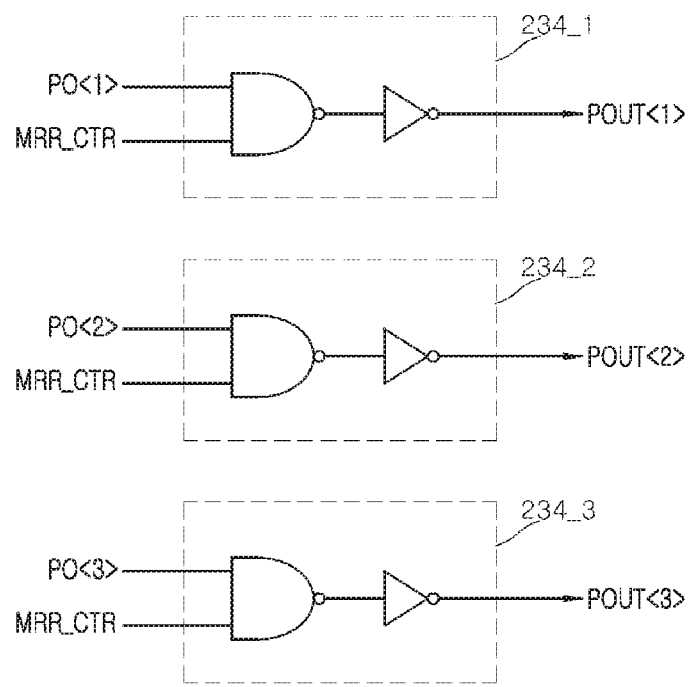
FIG. 7 is a circuit diagram, illustrating a configuration of an output control signal generation circuit that is included in an output control circuit as illustrated in FIG. 6.

Referring to FIG. 7, the output control signal generation circuit 233_4 may include a first logic circuit 2341, a second logic circuit 234_2 and a third logic circuit 234_3.

The first logic circuit 234_1 may generate the first output control signal POUT<1> from the first pre-output control signal PO<1> during a period in which the mode register control signal MRR_CTR is enabled. The first logic circuit 2341 may generate the first output control signal POUT<1> by buffering the first pre-output control signal PO<1> during a period in which the mode register control signal MRR_CTR is enabled to a logic high level. The first logic circuit 234_1 may block the generation of the first output control signal POUT<1> during a period in which the mode register control signal MRR_CTR is disabled to a logic low level. The first logic circuit 234_1 may generate the first output control signal POUT<1> by performing an AND operation on the mode register control signal MRR_CTR and the first pre-output control signal PO<1>.

The second logic circuit 234_2 may generate the second output control signal POUT<2> from the second pre-output control signal PO<2> during a period in which the mode register control signal MRR_CTR is enabled. The second logic circuit 234_2 may generate the second output control signal POUT<2> by buffering the second pre-output control signal PO<2> during a period in which the mode register control signal MRR_CTR is enabled to a logic high level. The second logic circuit 234_2 may block the generation of the second output control signal POUT<2> during a period in which the mode register control signal MRR_CTR is disabled to a logic low level. The second logic circuit 234_2 may generate the second output control signal POUT<2> by performing an AND operation on the mode register control signal MRR_CTR and the second pre-output control signal PO<2>.

The third logic circuit 234_3 may generate the third output control signal POUT<3> from the third pre-output control signal PO<3> during a period in which the mode register control signal MRR_CTR is enabled. The third logic circuit 2343 may generate the third output control signal POUT<3> by buffering the third pre-output control signal PO<3> during a period in which the mode register control signal MRR_CTR is enabled to a logic high level. The third logic circuit 234_3 may block the generation of the third output control signal POUT<3> during a period in which the mode register control signal MRR_CTR is disabled to a logic low level. The third logic circuit 234_3 may generate the third output control signal POUT<3> by performing an AND operation on the mode register control signal MRR_CTR and the third pre-output control signal PO<3>.

Figure 8:
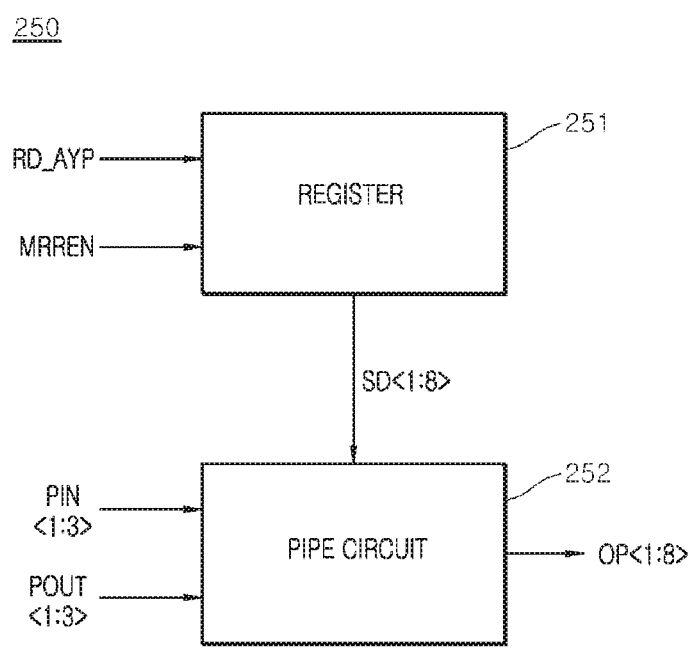
FIG. 8 is a block diagram, illustrating a configuration of an operation code generation circuit that is included in the semiconductor device as illustrated in FIG. 2.

Referring to FIG. 8, the operation code generation circuit 250 may include a register 251 and a pipe circuit 252.

The register 251 may output the storage data SD<1:8>, stored therein, during the mode register read operation. The register 251 may output the storage data SD<1:8>, stored therein, based on the logic levels of the mode register enable signal MRREN and the column control pulse RD_AYP. The register 251 may output the storage data SD<1:8>, stored therein, when the mode register enable signal MRREN is enabled to a logic high level and a pulse of the column control pulse RD_AYP is inputted at a logic high level. The storage data SD<1:8> may be set to a signal with internal information and operation information of the semiconductor device 120.

The pipe circuit 252 may latch the storage data SD<1:8> based on the first to third input control signals PIN<1:3>. The pipe circuit 252 may latch the storage data SD<1:8> when a pulse of any one of the first to third input control signals PIN<1:3> is inputted. The pipe circuit 252 may output the latched storage data SD<1:8> as the operation code OP<1:8> based on the first to third output control signals POUT<1:3>. The pipe circuit 252 may output the latched storage data SD<1:8> as the operation code OP<1:8> when a pulse of any one of the first to third output control signals POUT<1:3> is inputted.

Figure 9:
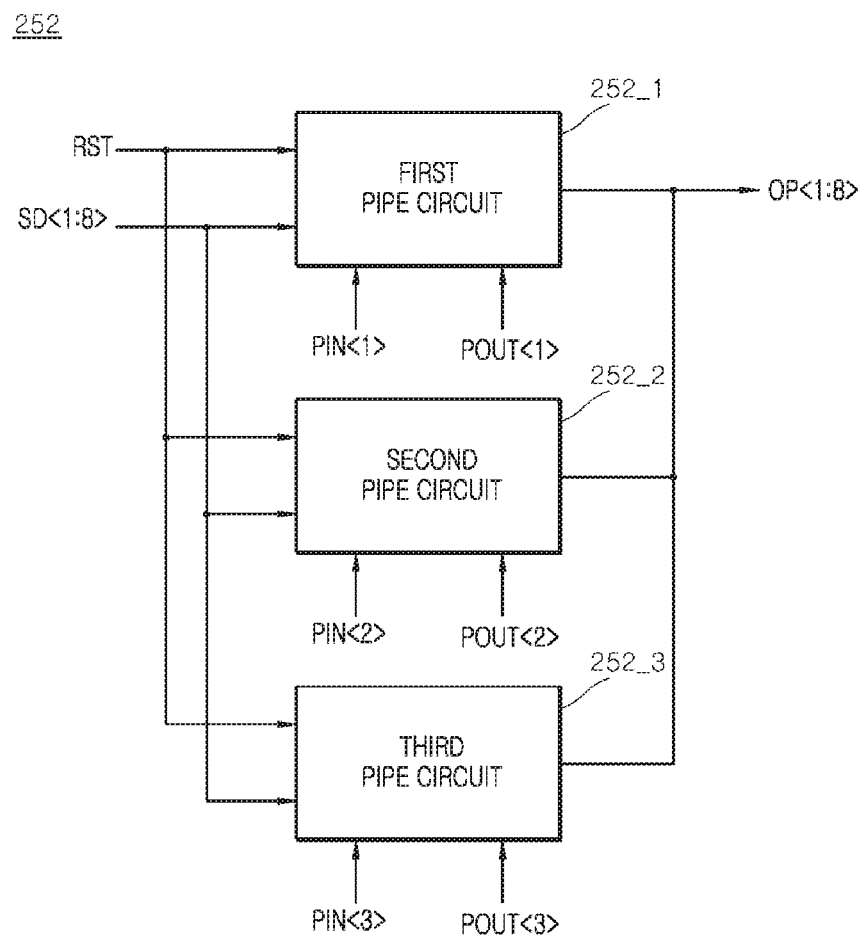
FIG. 9 is a block diagram, illustrating a configuration of a pipe circuit that is included in the operation code generation circuit as illustrated in FIG. 8.

Referring to FIG. 9, the pipe circuit 252 may include a first pipe circuit 252_1, a second pipe circuit 252_2 and a third pipe circuit 252_3.

The first pipe circuit 252_1 may latch the storage data SD<1:8> based on the first input control signal PIN<1>. The first pipe circuit 252_1 may latch the storage data SD<1:8> when a pulse of the first input control signal PIN<1> is inputted. The first pipe circuit 252_1 may output the latched storage data SD<1:8> as the operation code OP<1:8> based on the first output control signal POUT<1>. The first pipe circuit 252_1 may output the latched storage data SD<1:8> as the operation code OP<1:8> when a pulse of the first output control signal POUT<1> is inputted. The first pipe circuit 252_1 may generate the operation code OP<1:8> that is reset by a reset signal RST.

The second pipe circuit 252_2 may latch the storage data SD<1:8> based on the second input control signal PIN<2>. The second pipe circuit 252_2 may latch the storage data SD<1:8> when a pulse of the second input control signal PIN<2> is inputted. The second pipe circuit 252_2 may output the latched storage data SD<1:8> as the operation code OP<1:8> based on the second output control signal POUT<2>. The second pipe circuit 252_2 may output the latched storage data SD<1:8> as the operation code OP<1:8> when a pulse of the second output control signal POUT<2> is inputted. The second pipe circuit 252_2 may generate the operation code OP<1:8> that is reset by the reset signal RST.

The third pipe circuit 252_3 may latch the storage data SD<1:8> based on the third input control signal PIN<3>. The third pipe circuit 2523 may latch the storage data SD<1:8> when a pulse of the third input control signal PIN<3> is inputted. The third pipe circuit 252_3 may output the latched storage data SD<1:8> as the operation code OP<1:8> based on the third output control signal POUT<3>. The third pipe circuit 252_3 may output the latched storage data SD<1:8> as the operation code OP<1:8> when a pulse of the third output control signal POUT<3> is inputted. The third pipe circuit 252_3 may generate the operation code OP<1:8> that is reset by the reset signal RST.

Figure 10:
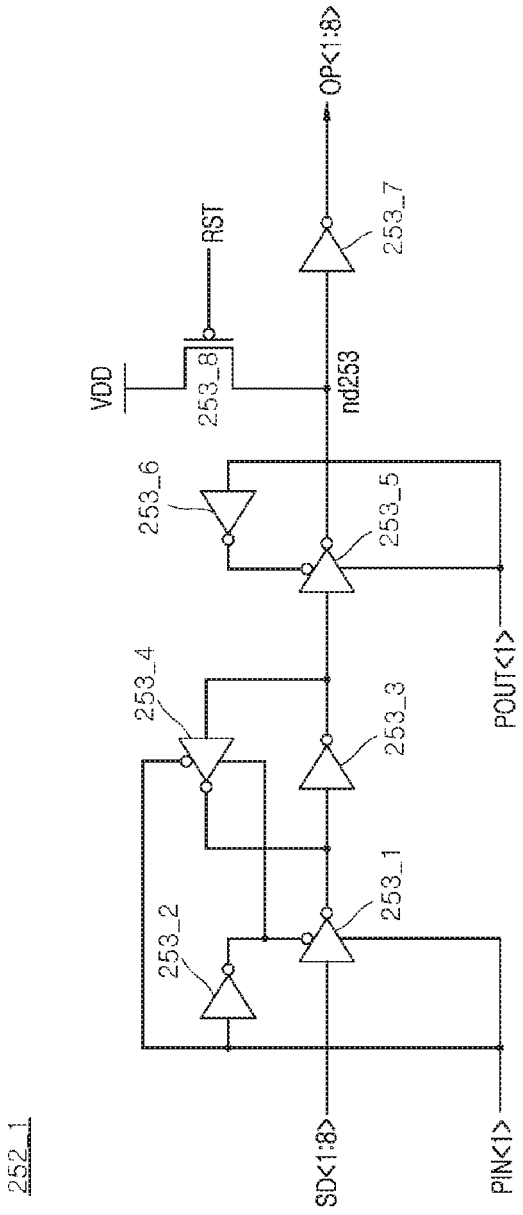
FIG. 10 is a circuit diagram, illustrating a configuration of a first pipe circuit included in the pipe circuit illustrated in FIG. 9.

Referring to FIG. 10, the first pipe circuit 252_1 may include inverters 253_1 to 253_7 and a PMOS transistor 253_8.

The first pipe circuit 252_1 may receive the storage data SD<1:8> through the inverters 253_1 and 253_2 when the first input control signal PIN<1> is inputted at a logic high level. When the first input control signal PIN<1> is inputted at a logic high level, the inverter 253_1 may be turned on to invert and buffer the storage data SD<1:8> and may be outputted the inverted and buffered data.

The first pipe circuit 252_1 may latch the received storage data SD<1:8> through the inverters 253_3 and 253_4 when the first input control signal PIN<1> is inputted at a logic low level. The inverter 253_3 may invert and buffer an output signal of the inverter 253_1 and may output the inverted and buffered signal. When the first input control signal PIN<1> is inputted at a logic low level, the inverters 253_3 and 253_4 may be turned on to latch the output signal of the inverter 253_1.

The first pipe circuit 2521 may generate the operation code OP<1:8> by buffering the output signal of the inverter 253_3 through the inverters 253_5 to 253_7, when the first output control signal POUT<1> is inputted at a logic high level. When the first output control signal POUT<1> is inputted at a logic high level, the inverter 253_5 may be turned on to invert and buffer the output signal of the inverter 253_3 and may be outputted the inverted and buffered signal to a node nd253. The inverter 253_7 may generate the operation code OP<1:8> by inverting and buffering the signal of the node nd253.

When the reset signal RST is inputted at a logic low level, the PMOS transistor 253_8 of the first pipe circuit 252_1 may be turned on to drive the node nd253 at the level of a supply voltage VDD. The first pipe circuit 252_1 may generate the operation code OP<1:8> that is reset to a logic low level by inverting and buffering the signal of the node nd253. The reset signal RST may be set to a signal with a pulse that is generated at a logic low level at the time of an initialization operation in which the electronic device 100 starts an operation.

Since the second and third pipe circuits 252_2 and 252_3 illustrated in FIG. 9 are configured as the same circuits as the first pipe circuit 252_1 illustrated in FIG. 10 and perform the same operation as the first pipe circuit 252_1 except input/output signals, the detailed descriptions thereof will be omitted herein.

Figure 11:
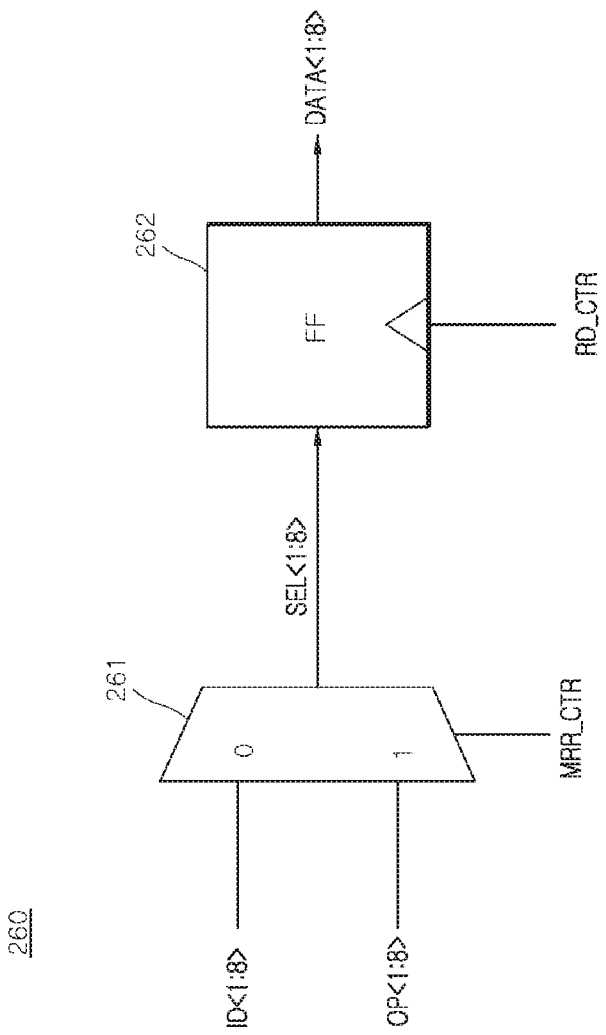
FIG. 11 is a block diagram, illustrating a configuration of an input/output circuit that is included in the semiconductor device as illustrated in FIG. 2.

Referring to FIG. 11, the input/output circuit 260 may include a selection transfer circuit 261 and a synchronization circuit 262.

The selection transfer circuit 261 may output any one of the internal data ID<1:8> and the operation code OP<1:8> as selection data SEL<1:8> based on the logic level of the mode register control signal MRR_CTR. The selection transfer circuit 261 may output the internal data ID<1:8> as the selection data SEL<1:8> when the mode register control signal MRR_CTR is disabled to a logic low level. The selection transfer circuit 261 may output the operation code OP<1:8> as the selection data SEL<1:8> when the mode register control signal MRR_CTR is enabled to a logic high level.

The synchronization circuit 262 may generate the data DATA<1:8> from the selection data SEL<1:8> in synchronization with the read control signal RD_CTR. The synchronization circuit 262 may output the selection data SEL<1:8> as the data DATA<1:8> in synchronization with the point of time that the read control signal RD_CTR is inputted at a logic high level.

Figure 12:
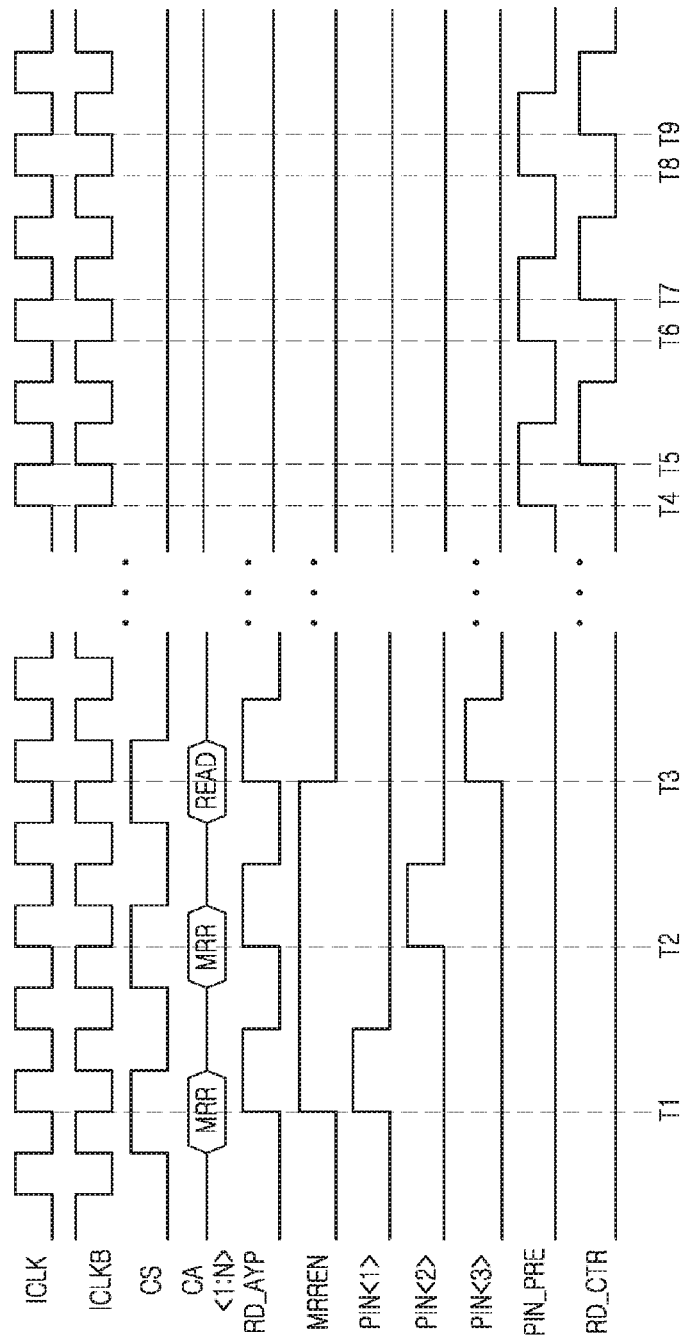
FIGS. 12 and 13 are timing diagrams for describing an operation of the electronic device in accordance with the present embodiment.
Figure 13:
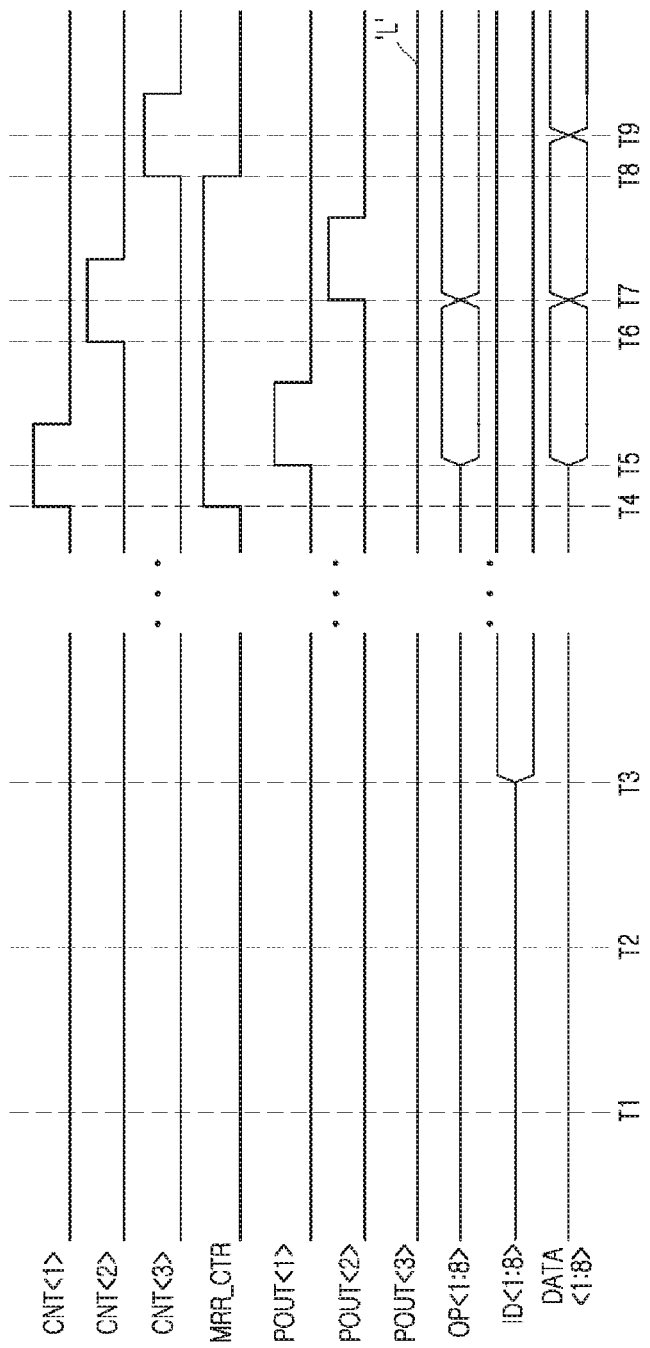

Referring to FIGS. 12 and 13, the operation of the electronic device 100 will be described. In the following descriptions, an operation in which the read operation is performed once after the mode register read operation is performed twice will be taken as an example.

The controller 110 outputs, to the semiconductor device 120, the clock CLK, the chip selection signal CS and the command address CA<1:N> to perform a first mode register read operation MRR.

The internal clock generation circuit 210 receives the clock CLK and generates the first internal clock ICLK and the second internal clock ICLKB.

At a time point T1, the column control circuit 220 generates the column control pulse RD_AYP with a logic high-level first pulse based on the chip selection signal CS and the command address CA<1:N> to perform the mode register read operation MRR in synchronization with the first internal clock ICLK and the second internal clock ICLKB. The column control circuit 220 generates the logic high-level mode register enable signal MRREN based on the chip selection signal CS and the command address CA<1:N> to perform the mode register read operation MRR in synchronization with the first internal clock ICLK and the second internal clock ICLKB.

The register 251 of the operation code generation circuit 250 outputs the storage data SD<1:8>, stored therein, based on the logic high-level mode register enable signal MRREN and the logic high-level column control pulse RD_AYP.

The pipe control circuit 232 of the control circuit 230 generates the first input control signal PIN<1> that is enabled to a logic high level by the first pulse of the column control pulse RD_AYP.

The latch circuit 233_3 of the output control circuit 232_2 latches the mode register enable signal MRREN based on the pulse of the first input control signal PIN<1>.

The pipe circuit 252 of the operation code generation circuit 250 latches the storage data SD<1:8> based on the logic high-level first input control signal PIN<1>.

The controller 110 outputs, to the semiconductor device 120, the clock CLK, the chip selection signal CS and the command address CA<1:N> to perform a second mode register read operation MRR.

At a time point T2, the column control circuit 220 generates the column control pulse RD_AYP with a logic high-level second pulse based on the chip selection signal CS and the command address CA<1:N> to perform the mode register read operation MRR in synchronization with the first internal clock ICLK and the second internal clock ICLKB. The column control circuit 220 generates the logic high-level mode register enable signal MRREN based on the chip selection signal CS and the command address CA<1:N> to perform the mode register read operation MRR in synchronization with the first internal clock ICLK and the second internal clock ICLKB.

The register 251 of the operation code generation circuit 250 outputs the storage data SD<1:8>, stored therein, based on the logic high-level mode register enable signal MRREN and the logic high-level column control pulse RD_AYP.

The pipe control circuit 232 of the control circuit 230 generates the second input control signal PIN<2> that is enabled to a logic high level by the second pulse of the column control pulse RD_AYP.

The pipe circuit 252 of the operation code generation circuit 250 latches the storage data SD<1:8> based on the logic high-level second input control signal PIN<2>.

The controller 110 outputs, to the semiconductor device 120, the clock CLK, the chip selection signal CS and the command address CA<1:N> to perform a first read operation READ.

At a time point T3, the column control circuit 220 generates the column control pulse RD_AYP with a logic high-level third pulse based on the chip selection signal CS and the command address CA<1:N> to perform the read operation READ in synchronization with the first internal clock ICLK and the second internal clock ICLKB. The column control circuit 220 generates the logic low-level mode register enable signal MRREN based on the chip selection signal CS and the command address CA<1:N> to perform the read operation READ in synchronization with the first internal clock ICLK and the second internal clock ICLKB.

The core circuit 240 outputs the internal data ID<1:8>, stored therein, based on the logic low-level mode register enable signal MRREN and the logic high-level column control pulse RD_AYP.

The pipe control circuit 232 of the control circuit 230 generates the third input control signal PIN<3> that is enabled to a logic high level by a third pulse of the column control pulse RD_AYP.

At a time point T4, the delay circuit 231 generates the pre-input control signal PIN_PRE with a logic high-level first pulse by delaying the column control pulse RD_AYP at the time point T1.

The output control circuit 232_2 generates the first counting signal CNT<1> that is counted at a logic high level by the first pulse of the pre-input control signal PIN_PRE.

The latch circuit 233_3 of the output control circuit 232_2 generates the logic high-level mode register control signal MRR_CTR from the latched mode register enable signal MRREN based on the logic high-level first counting signal CNT<1>.

At a time point T5, the delay circuit 231 generates the read control signal RD_CTR with a logic high-level first pulse by delaying the pre-input control signal PIN_PRE of the time point T4.

The output control circuit 232_2 generates the logic high-level first output control signal POUT<1> from the first counting signal CNT<1> based on the logic high-level mode register control signal MRR_CTR.

The pipe circuit 252 of the operation code generation circuit 250 generates the operation code OP<1:8> from the storage data SD<1:8> latched at the time point T1, based on the logic high-level first output control signal POUT<1>.

The selection transfer circuit 261 of the input/output circuit 260 outputs the operation code OP<1:8> as the selection data SEL<1:8> based on the logic high-level mode register control signal MRR_CTR.

The synchronization circuit 262 of the input/output circuit 260 outputs the selection data SEL<1:8> as the data DATA<1:8> in synchronization with the logic high-level read control signal RD_CTR.

At a time point T6, the delay circuit 231 generates the pre-input control signal PIN_PRE with a logic high-level second pulse by delaying the column control pulse RD_AYP of the time point T2.

The output control circuit 2322 generates the second counting signal CNT<2> that is counted at a logic high level by the second pulse of the pre-input control signal PIN_PRE.

The latch circuit 233_3 of the output control circuit 232_2 generates the logic high-level mode register control signal MRR_CTR from the latched mode register enable signal MRREN based on the logic high-level second counting signal CNT<2>.

At a time point T7, the delay circuit 231 generates the read control signal RD_CTR with a high-level second pulse by delaying the pre-input control signal PIN_PRE of the time point T6.

The output control circuit 2322 generates the logic high-level second output control signal POUT<2> from the second counting signal CNT<2> based on the logic high-level mode register control signal MRR_CTR.

The pipe circuit 252 of the operation code generation circuit 250 generates the operation code OP<1:8> from the storage data SD<1:8> latched at the time point T2, based on the logic high-level second output control signal POUT<2>.

The selection transfer circuit 261 of the input/output circuit 260 outputs the operation code OP<1:8> as the selection data SEL<1:8> based on the high-level mode register control signal MRR_CTR.

The synchronization circuit 262 of the input/output circuit 260 outputs the selection data SEL<1:8> as the data DATA<1:8> in synchronization with the logic high-level read control signal RD_CTR.

At a time point T8, the delay circuit 231 generates the pre-input control signal PIN_PRE with a logic high-level third pulse by delaying the column control pulse RD_AYP of the time point T3.

The output control circuit 232_2 generates the third counting signal CNT<3> that is counted at a logic high level by the third pulse of the pre-input control signal PIN_PRE.

The latch circuit 233_3 of the output control circuit 232_2 generates the logic low-level mode register control signal MRR_CTR from the latched mode register enable signal MRREN based on the logic high-level third counting signal CNT<3>.

At a time point T9, the delay circuit 231 generates the read control signal RD_CTR with a logic high-level third pulse by delaying the pre-input control signal PIN_PRE of the time point T8.

The output control circuit 232_2 generates the logic low-level third output control signal POUT<3> based on the logic low-level mode register control signal MRR_CTR.

The pipe circuit 252 of the operation code generation circuit 250 does not generate the operation code OP<1:8> based on the logic low-level third output control signal POUT<3>.

The selection transfer circuit 261 of the input/output circuit 260 outputs the internal data ID<1:8> as the selection data SEL<1:8> based on the logic low-level mode register control signal MRR_CTR.

The synchronization circuit 262 of the input/output circuit 260 outputs the selection data SEL<1:8> as the data DATA<1:8> in synchronization with the logic high-level read control signal RD_CTR.

The electronic device 100 may generate the signal to perform the read operation and the mode register read operation by delaying the signal through one delay circuit, thereby reducing the area.

Figure 14:
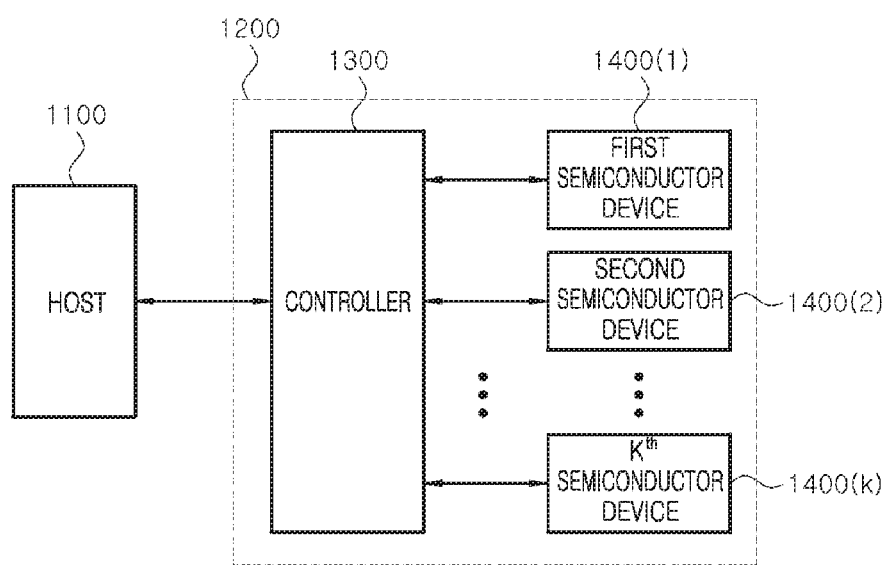
FIG. 14 is a diagram, illustrating a configuration of an electronic system in accordance with an embodiment to which the electronic device, illustrated in FIGS. 1 to 13, is applied.

FIG. 14 is a block diagram illustrating a configuration of an electronic system 1000. As illustrated in FIG. 14, the electronic system 1000 may include a host 1100 and a semiconductor system 1200.

The host 1100 and the semiconductor system 1200 may transmit/receive signals to/from each other using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect—Express), ATA (Advanced Technology Attachment), SATA (Serial ATA), PATA (Parallel ATA), SAS (serial attached SCSI), USB (Universal Serial Bus) and the like.

The semiconductor system 1200 may include a controller 1300 and semiconductor devices 1400(K:1). The controller 1300 may control the semiconductor devices 1400(K:1) to perform a read operation and a mode register read operation. Each of the semiconductor devices 1400(K:1) may generate a signal to perform the read operation and the mode register read operation by delaying the signal through one delay circuit, thereby reducing the area.

The controller 1300 may be implemented as the controller 110 illustrated in FIG. 1. Each of the semiconductor devices 1400(K:1) may be implemented as the semiconductor device 120 illustrated in FIG. 1. Based on an embodiment, the semiconductor device 120 may be implemented as one of a DRAM (dynamic random access memory), PRAM (Phase change Random Access Memory), RRAM (Resistive Random Access Memory), MRAM (Magnetic Random Access Memory) and FRAM (Ferroelectric Random Access Memory).

While various embodiments have been described above, it will be understood to those skilled in the art that the embodiments described are examples only. Accordingly, the electronic device described herein should not be limited based on the described embodiments.

What is claimed is:

1. An electronic device comprising:
    a column control circuit configured to generate a column control pulse and a mode register enable signal, each with a pulse that is generated based on logic levels of a chip selection signal and a command address; and
    a control circuit configured to generate a read control signal to perform a read operation and a mode register read operation by delaying the column control pulse based on a logic level of the mode register enable signal and configured to generate a mode register control signal to perform the mode register read operation by delaying the column control pulse based on a logic level of the mode register enable signal.

2. The electronic device of claim 1, wherein the column control pulse comprises a pulse that is generated during the read operation and the mode register read operation.

3. The electronic device of claim 1, wherein the mode register enable signal is enabled during the mode register read operation.

4. The electronic device of claim 1, wherein the mode register control signal is generated from the column control pulse when the mode register enable signal is enabled.

5. The electronic device of claim 1, wherein the control circuit comprises:
    a delay circuit configured to generate a pre-input control signal and the read control signal, each with pulses that are sequentially generated, by delaying the column control pulse; and
    a pipe control circuit configured to generate a first input control signal and a second input control signal that are enabled by the column control pulse, configured to generate the mode register control signal from the mode register enable signal based on the first and second input control signals, and configured to generate a first output control signal and a second output control signal from the mode register control signal and the pre-input control signal.

6. The electronic device of claim 5, wherein the delay circuit comprises:
    a first delay circuit configured to generate a delay signal by delaying the column control pulse;
    a second delay circuit configured to generate the pre-input control signal by delaying the delay signal; and
    a third delay circuit configured to generate the read control signal by delaying the pre-input control signal.

7. The electronic device of claim 5, wherein the pipe control circuit comprises:
    an input control circuit configured to generate the first and second input control signals, which are sequentially counted, based on pulses of the column control pulse; and
    an output control circuit configured to generate the mode register control signal by latching the mode register enable signal based on the first and second input control signals, and generate the first and second output control signals from the pre-input control signal based on the logic level of the mode register control signal.

8. The electronic device of claim 7, wherein the output control circuit comprises:
- a counter configured to generate a first counting signal and a second counting signal, which are sequentially counted, based on pulses of the pre-input control signal;
- a fourth delay circuit configured to generate a first pre-output control signal and a second pre-output control signal by delaying the first and second counting signals;
- a latch circuit configured to latch the mode register enable signal based on pulses of the first and second input control signals, and generate the mode register control signal from the latched mode register enable signal based on pulses of the first and second counting signals; and
- an output control signal generation circuit configured to generate the first and second output control signals from the first and second pre-output control signals during a period in which the mode register control signal is enabled.

9. The electronic device of claim 1, further comprising an input/output circuit configured to output internal data, generated from a core circuit, as data in synchronization with the read control signal when the mode register control signal is disabled, and configured to output an operation code, generated from an operation code generation circuit, as the data in synchronization with the read control signal when the mode register control signal is enabled.

10. The electronic device of claim 9, wherein the input/output circuit comprises:
- a selection transfer circuit configured to output the internal data as selection data when the mode register control signal is disabled and configured to output the operation code as the selection data when the mode register control signal is enabled; and
- a synchronization circuit configured to generate the data from the selection data in synchronization with the read control signal.

11. An electronic device comprising:
- a control circuit configured to generate a read control signal and a mode register control signal by delaying a column control pulse based on a logic level of a mode register enable signal, configured to generate a first input control signal and a second input control signal based on the column control signal, and configured to generate a first output control signal and a second output control signal based on the mode register enable signal and the column control pulse;
- an operation code generation circuit configured to latch storage data, stored therein, based on the first and second input control signals and configured to output the latched storage data as an operation code based on the first and second output control signals; and
- an input/output circuit configured to output any one of internal data and the operation code as data based on the mode register control signal and the read control signal.

12. The electronic device of claim 11, wherein the mode register enable signal is enabled when a logic level combination of a chip selection signal and a command address is a logic level combination to perform a mode register read operation, and the column control pulse comprises a pulse that is generated when the logic level combination of the chip selection signal and the command address is a logic level combination to perform the mode register read operation and a read operation.

13. The electronic device of claim 11, wherein the mode register control signal is generated from the column control pulse when the mode register enable signal is enabled.

14. The electronic device of claim 11, wherein the control circuit comprises:
- a delay circuit configured to generate a pre-input control signal and the read control signal each with pulses, which are sequentially generated, by delaying the column control pulse; and
- a pipe control circuit configured to generate a first input control signal and a second input control signal that are enabled by the column control pulse, configured to generate the mode register control signal from the mode register enable signal based on the first and second input control signals, and configured to generate a first output control signal and a second output control signal from the mode register control signal and the pre-input control signal.

15. The electronic device of claim 14, wherein the delay circuit comprises:
- a first delay circuit configured to generate a delay signal by delaying the column control pulse;
- a second delay circuit configured to generate the pre-input control signal by delaying the delay signal; and
- a third delay circuit configured to generate the read control signal by delaying the pre-input control signal.

16. The electronic device of claim 14, wherein the pipe control circuit comprises:
- an input control circuit configured to generate the first and second input control signals, which are sequentially counted, based on pulses of the column control pulse; and
- an output control circuit configured to generate the mode register control signal by latching the mode register enable signal based on the first and second input control signals and configured to generate the first and second output control signals from the pre-input control signal based on the logic level of the mode register control signal.

17. The electronic device of claim 16, wherein the output control circuit comprises:
- a counter configured to generate a first counting signal and a second counting signal, which are sequentially counted, based on pulses of the pre-input control signal;
- a fourth delay circuit configured to generate a first pre-output control signal and a second pre-output control signal by delaying the first and second counting signals;
- a latch circuit configured to latch the mode register enable signal based on pulses of the first and second input control signals and configured to generate the mode register control signal from the latched mode register enable signal based on pulses of the first and second counting signals; and
- an output control signal generation circuit configured to generate the first and second output control signals from the first and second pre-output control signals during a period in which the mode register control signal is enabled.

18. The electronic device of claim 11, wherein the operation code generation circuit comprises:
- a register configured to output the storage data, stored therein, based on the logic levels of the mode register enable signal and the column control pulse; and
- a pipe circuit configured to latch the storage data based on the first and second input control signals and configured to output the latched storage data as the operation code based on the first and second output control signals.

19. The electronic device of claim 18, wherein the pipe circuit comprises:
- a first pipe circuit configured to latch the storage data based on the first input control signal and configured to output the latched storage data as the operation code based on the first output control signal; and
- a second pipe circuit configured to latch the storage data based on the second input control signal and configured to output the latched storage data as the operation code based on the second output control signal.

20. The electronic device of claim 11, wherein the input/output circuit comprises:
- a selection transfer circuit configured to output the internal data as selection data when the mode register control signal is disabled and configured to output the operation code as the selection data when the mode register control signal is enabled; and
- a synchronization circuit configured to generate the data from the selection data in synchronization with the read control signal.

\* \* \* \* \*